United States Patent
Yokoyama et al.

(10) Patent No.: US 7,429,778 B2
(45) Date of Patent: Sep. 30, 2008

(54) METHODS FOR FORMING WIRING AND ELECTRODE

(75) Inventors: Yasuaki Yokoyama, deceased, late of Tokyo (JP); by Michiko Yokoyama, legal representative, Mie (JP); by Naomi Shinoda, legal representative, Aichi (JP); by Risa Yokoyama, legal representative, Mie (JP); Isamu Yonekura, Tokyo (JP); Takashi Satoh, Osaka (JP); Tamaki Wakasaki, Osaka (JP); Yasumasa Takeuchi, Kawasaki (JP); Masayuki Endo, Kawasaki (JP)

(73) Assignees: JSR Corporation, Tokyo (JP); Sharp Corporation, Osaka-shi (JP)

( * ) Notice: Subject to any disclaimer, the term of this patent is extended or adjusted under 35 U.S.C. 154(b) by 315 days.

(21) Appl. No.: 11/237,869

(22) Filed: Sep. 29, 2005

(65) Prior Publication Data

US 2006/0024937 A1 Feb. 2, 2006

Related U.S. Application Data

(62) Division of application No. 10/808,441, filed on Mar. 25, 2004, now Pat. No. 7,071,084.

(30) Foreign Application Priority Data

Mar. 28, 2003 (JP) ............................. 2003-091789

(51) Int. Cl.
*H01L 29/00* (2006.01)

(52) U.S. Cl. .............................. 257/520; 257/E23.075; 428/209

(58) Field of Classification Search ................ 257/520, 257/E23.075; 428/209
See application file for complete search history.

(56) References Cited

U.S. PATENT DOCUMENTS

| 3,244,554 A | * | 4/1966 | Prestridge et al. ........... 427/252 |
| 3,462,288 A | | 8/1969 | Schmidt et al. |
| 3,705,051 A | | 12/1972 | Kobetz |

FOREIGN PATENT DOCUMENTS

| GB | 1178954 | 1/1970 |
| JP | 10-335267 | 12/1998 |
| WO | WO 01/54203 A2 | 7/2001 |

OTHER PUBLICATIONS

J. K. Ruff, et al., J. Amer. Chem. Soc., vol. 82, pp. 2141-21044, "The Amine Complexes of Aluminum Hydride", 1960.
G. W. Fraser, et al., J. Chem. Soc., pp. 3742-3749, "Aluminium Hydride Adducts of Trimethylamine: Vibrational Spectra and Structure", 1963.
J. L. Atwood, et al., J. Amer. Chem. Soc., vol. 113, No. 21, pp. 8183-8185, "Tertiary Amine Stabilized Dialane", 1991.

* cited by examiner

*Primary Examiner*—Asok K Sarkar
(74) *Attorney, Agent, or Firm*—Oblon, Spivak, McClelland, Maier & Neustadt, P.C.

(57) ABSTRACT

There is provided a method for forming wiring or an electrode by coating a substrate with a composition comprising (A) a complex of an amine compound and a hydrogenated aluminum compound and (B) a titanium compound or a composition comprising the complex and (C) metal particles and subjecting the obtained coating film to heating and/or a light treatment. By the method, a film can be formed that uses a conductive film forming composition with which wiring and an electrode that can be suitably used for electronic devices can be formed easily and inexpensively.

6 Claims, No Drawings

METHODS FOR FORMING WIRING AND ELECTRODE

BACKGROUND OF THE INVENTION

1. Field of the Invention

The present invention relates to a composition for forming a conductive film and a method for forming wiring or an electrode on a substrate by use thereof. More specifically, it relates to a conductive film forming method which can be suitably used in formation of wiring or an electrode for an electronic device.

2. Description of the Related Art

Aluminum is used as a wiring material used in a number of electronic devices such as a solar cell, a semiconductor device and an electronic display device. Heretofore, it has been generally practiced that such an aluminum film is formed by a vacuum process such as sputtering, vacuum deposition or CVD and the obtained aluminum film is then processed into an aluminum pattern by photo-etching using a resist. However, this method is disadvantageous from the viewpoint of energy consumption since it requires a large-scale vacuum deposition apparatus. Further, since it is difficult to form aluminum wiring uniformly on a large-area substrate by this method, a yield is poor, causing an increase in costs.

Meanwhile, in recent years, a paste which has fine aluminum particles dispersed in a binder has been developed, and a method of forming a pattern of aluminum by pattern-printing the paste by, e.g., screen printing, and baking the printed paste has been reported (JP-A 10-335267) (the term "JP-A" as used herein means an "unexamined published Japanese patent application"). This method can be carried out at a low cost because it deals with direct patterning by printing of the aluminum paste. However, obtained aluminum is liable to contain impurities, an aluminum pattern with a low resistance is difficult to obtain, and formation of a fine pattern by the method is difficult from a technical standpoint.

Further, a method has been developed that comprises coating a solution of a specific organic aluminum compound by, e.g., spin coating so as to form a coating film and baking the film so as to form a conductive film. In this method, organic components of the organic aluminum used and a solvent used scatter, thereby making the obtained film inevitably liable to have a lower density than a film formed by a vacuum method such as sputtering. Accordingly, when a high-density film is required as in the case where the obtained film is used as a conductive film, the low density of the film obtained by the above method may be a problem.

SUMMARY OF THE INVENTION

The present invention has been conceived under the above circumstances. Thus, an object of the present invention is to provide a composition for forming a conductive film which can form wiring or an electrode which can be suitably used in a number of electronic devices easily and inexpensively, and a film forming method using the composition.

Another object of the present invention is to provide wiring and an electrode which are formed by the method of the present invention.

Other objects and advantages of the present invention will become apparent from the following description.

According to the present invention, firstly, the above objects and advantages of the present invention are achieved by a composition for forming a conductive film comprising a complex of an amine compound and hydrogenated aluminum compound, and a titanium compound.

According to the present invention, secondly, the above objects and advantages of the present invention are achieved by a method for forming a conductive film (hereinafter may be referred to as a first method of the present invention) which comprises coating a substrate with a composition comprising (A) a complex of an amine compound and a hydrogenated aluminum compound, and (B) a titanium compound and then subjecting the obtained coating film to heating and/or a light treatment to form a conductive film.

According to the present invention, thirdly, the above objects and advantages of the present invention are achieved by a method for forming a conductive film (hereinafter may be referred to as a second method of the present invention) which comprises coating a substrate with a composition comprising (A) a complex of an amine compound and a hydrogenated aluminum compound, and (C) metal particles and then subjecting the obtained coating film to heating and/or a light treatment to form a conductive film.

According to the present invention, fourthly, the above objects and advantages of the present invention are achieved by wiring and an electrode of a conductive film which are formed by the above methods of the present invention.

Hereinafter, the present invention will be further described.

DETAILED DESCRIPTION OF THE PREFERRED EMBODIMENTS

Firstly, the film forming composition used in the first method of the present invention will be described.

Hydrogenated aluminum (often briefly referred to as "alan") used in the present invention is a compound comprising aluminum and a hydrogen atom, and it is believed that the compound generally has a formula represented by $AlH_3$.

The complex of an amine compound and alan which is used in the film forming composition in the present invention can be synthesized in accordance with methods described in J. K. Ruff et al., J. Amer. Chem. Soc., vol. 82, p. 2141, 1960; G. W. Fraser et al., J. Chem. Soc., p. 3742, 1963; and J. L. Atwood et al., J. Amer. Chem. Soc., vol. 113, p. 8133, 1991.

For example, the complex of an amine compound and alan which is used in the film forming composition in the present invention can be synthesized by adding a hydrochloride of an amine compound to a diethyl ether solution of aluminum lithium hydride and causing them to react under agitation at room temperature in an $N_2$ gas, for example. After completion of the reaction, by-produced lithium chloride and unreacted aluminum lithium hydride are removed from the reaction solution by a filter or the like, a desired coating solution is added to the resulting solution, and then a solvent used in the reaction, e.g., diethyl ether, is removed under a reduced pressure so as to give the target product. The reaction temperature, the reaction solvent, etc. are selected according to the type of the desired complex of an amine compound and alan.

The amine compound used in the present invention may be a polyamine compound such as a monoamine compound, a diamine compound, a triamine compound or a tetraamine compound.

The monoamine compound is represented by, for example, the following formula (1):

$$R^1R^2R^3N \qquad (1)$$

wherein $R^1$, $R^2$ and $R^3$ are each independently a hydrogen atom, an alkyl group, an alkenyl group, an alkynyl group, a cycloalkyl group or an aryl group.

Suitable specific examples of $R^1$, $R^2$ and $R^3$ in the formula (1) include hydrogen, an alkyl group having 1 to 12 carbon atoms such as methyl, ethyl, propyl, butyl, pentyl, hexyl, heptyl, octyl, nonyl, decyl, undecyl and dodecyl groups, an alkenyl group having an unsaturated group such as a metaallyl group, an alkynyl group such as a phenylethynyl group, an alicyclic alkyl group such as a cyclopropyl group, and an aryl group such as phenyl and benzyl groups. These alkyl, alkenyl and alkynyl groups may be linear, cyclic or branched.

Specific examples of the compound represented by the formula (1) include ammonia, trimethylamine, triethylamine, tri-n-propylamine, tri-isopropylamine, tricyclopropylamine, tri-n-butylamine, triisobutylamine, tri-t-butylamine, tri-2-methylbutylamine, tri-n-hexylamine, tricyclohexylamine, tri(2-ethylhexyl)amine, trioctylamine, triphenylamine, tribenzylamine, dimethylphenylamine, diethylphenylamine, diisobutylphenylamine, methyldiphenylamine, ethyldiphenylamine, isobutyldiphenylamine, dimethylamine, diethylamine, di-n-propylamine, diisopropylamine, dicyclopropylamine, di-n-butylamine, diisobutylamine, di-t-butylamine, methylethylamine, methylbutylamine, di-n-hexylamine, dicyclohexylamine, di(2-ethylhexyl)amine, dioctylamine, diphenylamine, dibenzylamine, methylphenylamine, ethylphenylamine, isobutylphenylamine, methylmethacrylamine, methyl(phenylethynyl)amine, phenyl(phenylethynyl)amine, methylamine, ethylamine, n-propylamine, isopropylamine, cyclopropylamine, n-butylamine, isobutylamine, t-butylamine, 2-methylbutylamine, n-hexylamine, cyclohexylamine, 2-ethylhexylamine, octylamine, phenylamine and benzylamine.

Illustrative examples of the polyamine compound include ethylenediamine, N,N'-dimethylethylenediamine, N,N'-diethylethylenediamine, N,N'-diisopropylethylenediamine, N,N'-di-t-butylethylenediamine, N,N'-diphenylethylenediamine, N,N,N',N'-tetramethylethylenediamine, N,N,N',N'-tetraethylethylenediamine, diethylenetriamine, 1,7-dimethyl-1,4,7-triazaheptane, 1,7-diethyl-1,4,7-triazaheptane, triethylenetetraamine, phenylenediamine, N,N,N',N'-tetramethyldiaminobenzene, 1-aza-bicyclo[2.2.1]heptane, 1-aza-bicyclo[2.2.2]octane (quinuclidine), 1-azacyclohexane, 1-aza-cyclohexane-3-ene, N-methyl-1-azacyclohexane-3-ene, morpholine, N-methyl morpholine, N-ethyl morpholine, piperazine, and N,N',N''-trimethyl-1,3,5-triazacyclohexane. These amine compounds can be used alone or in admixture of two or more.

Illustrative examples of the titanium-containing compound which is used in the present invention include a compound represented by the following formula (2):

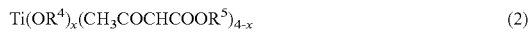

$$Ti(OR^4)_x(CH_3COCHCOOR^5)_{4-x} \quad (2)$$

wherein $R^4$ and $R^5$ are the same or different and are an alkyl group or a phenyl group, and x is 0 or an integer of 1 to 4, a compound represented by the following formula (3):

$$Ti(OR^6)_y(X)_{4-y} \quad (3)$$

wherein $R^6$ is an alkyl group or a phenyl group, X is a halogen atom, and y is an integer of 1 to 3, a compound represented by the following formula (4):

$$Ti(OR^7)_z(NHR^8)_{4-z} \quad (4)$$

wherein $R^7$ and $R^8$ are the same or different and are an alkyl group or a phenyl group, and z is 0 or an integer of 1 to 3, and a compound represented by the following formula (5):

$$Ti(Cp)_n(Y)_{4-n} \quad (5)$$

wherein Cp is cyclopentadienyl group, Y is a halogen atom or an alkyl group, and n is an integer of 1 to 4.

Specific examples of the titanium-containing compound include titanium alkoxides such as titanium methoxide, titanium ethoxide, titanium-n-propoxide, titanium-n-nonyl oxide, titanium stearyl oxide, titanium isopropoxide, titanium-n-butoxide, titanium isobutoxide, titanium-t-butoxide, titanium tetrakis(bis-2,2-(allyloxymethyl)butoxide, titanium triisostearoyl isopropoxide, titanium trimethylsiloxide, titanium-2-ethylhexoxide, titanium methacrylate triisopropoxide, (2-methacryloxyethoxy)triisopropoxy titanate, titanium methoxypropoxide, titanium phenoxide, titanium methylphenoxide, poly(dibutyltitanate), poly(octylene glycol titanate), titanium bis(triethanol amine)diisopropoxide, titanium tris(dodecylbenzenesulfonate)isopropoxide, titanium trimethacrylate methoxyethoxyethoxide, titanium tris(dioctylpyrophosphate)isopropoxide and titanium lactate; amino-group-containing titanium compounds such as tetrakis(dimethylamino)titanium and tetrakis(diethylamino)titanium; titanium complexes with β-diketones such as titanium bis(ethylacetoacetate)diisopropoxide, tris(2,2,6,6-tetramethyl-3,5-heptanedionate)titanium, titanium oxide bis(pentanedionate), titanium oxide(tetramethylheptanedionate), titanium methacryloxyacetoacetate triisopropoxide, titanium di-n-butoxide(bis-2,4-pentanedionate), titanium diisopropoxide(bis-2,4-pentanedionate), titanium diisopropoxide bis(tetramethylheptanedionate), titanium diisopropoxide bis(ethylacetoacetate), titanium tetraethylacetoacetate, titanium tetramethylacetoacetate, di(iso-propoxide)bis(2,2,6,6-tetramethyl-3,5-heptane dionate)titanium and titanium allylacetoacetate triisopropoxide; titanium compounds containing a cyclopentadienyl group such as dicyclopentadienyl titanium dichloride, dicyclopentadienyl titanium dibromide, cyclopentadienyl titanium trichloride, cyclopentadienyl titanium tribromide, dicyclopentadienyl dimethyl titanium, dicyclopentadienyl diethyl titanium, dicyclopentadienyl di-t-butyl titanium, dicyclopentadienyl phenyl titanium chloride, dicyclopentadienyl methyl titanium chloride, (trimethyl)pentamethylcyclopentadienyl titanium and dimethyl bis(t-butylcyclopentadienyl)titanium; and titanium compounds having a halogen atom such as indenyl titanium trichloride, pentamethylcyclopentadienyl titanium trichloride, pentamethylcyclopentadienyl titanium trimethoxide, trichlorotris(tetrahydrofuran)titanate, tetrachlorobis(tetrahydrofuran)titanium, titanium chloride triisopropoxide, titanium iodide triisopropoxide, titanium dichloride diethoxide, dichlorobis(2,2,6,6-tetramethyl-3,5-heptanedionate)titanium, tetrachlorobis(cyclohexylmercapto)titanium and titanium chloride.

The film forming composition in the present invention which comprises (1) the complex of the amine compound and the hydrogenated aluminum compound, (2) the titanium-containing compound, and in some cases, (3) a solvent is not limited to a particular production method. The composition is prepared by adding a given amount of the titanium-containing compound to a solution of the complex of the amine compound and the hydrogenated aluminum compound under agitation. The temperature at which the titanium-containing compound is added is preferably 0 to 150° C., more preferably 5 to 100° C. The agitation time is preferably 0.1 to 120 minutes, more preferably 0.2 to 60 minutes. When the temperature of the addition is higher than 150° C. or the agitation time is longer than 120 minutes, a nonuniform solution may be prepared or a precipitate may be produced. Meanwhile, when the temperature of the addition is lower than 0° C. or the agitation time is shorter than 0.1 minutes, a baked film (e.g., a conductive film) having a high film density may not be obtained.

The solvent used in this reaction may be any solvent capable of dissolving the complex of the amine compound and the hydrogenated aluminum compound and the titanium-containing compound. As the solvent, the same solvents as those to be described later which can be used for the film forming composition can be used.

The film forming composition used in the present invention may contain an aluminum compound other than the complex of the amine compound and the alan. Illustrative examples of aluminum compounds other than the above complex which can be added include trimethyl aluminum, triethyl aluminum, tri-n-propyl aluminum, tricyclopropyl aluminum, tri-n-butyl aluminum, triisobutyl aluminum, tri-t-butyl aluminum, tri-2-methylbutyl aluminum, tri-n-hexyl aluminum, tricyclohexyl aluminum, tri(2-ethylhexyl)aluminum, trioctyl aluminum, triphenyl aluminum, tribenzyl aluminum, dimethylphenyl aluminum, diethylphenyl aluminum, diisobutylphenyl aluminum, methyldiphenyl aluminum, ethyldiphenyl aluminum, isobutyldiphenyl aluminum, diethyl aluminum hydride, diisobutyl aluminum hydride, diphenyl aluminum hydride, dimethyl methacryl aluminum, dimethyl(phenylethynyl)aluminum, diphenyl(phenylethynyl)aluminum, a dimethylamine.dimethyl aluminum complex, a diethylamine.diethyl aluminum complex, a dimethylamine.diethyl aluminum complex, a diethylamine.dimethyl aluminum complex, a diphenylamine.dimethyl aluminum complex and a diphenylamine.diethyl aluminum complex. These aluminum compounds can be used alone or in combination of two or more.

As for the proportions of the complex (1) of the amine compound and the hydrogenated aluminum compound and the titanium-containing compound (2), the amount of the titanium-containing compound (2) is preferably 0.001 to 30 mol %, more preferably 0.005 to 20 mol %, based on the total of the complex (1) and the compound (2). When the amount of the titanium-containing compound (1) is smaller than 0.001 mol %, a film with a high density may not be obtained, while when it is larger than 30 mol %, the stability of the solution may be difficult to attain.

The solution of the film forming composition in the present invention can be used in admixture of fines particles of metal such as gold, silver, copper, aluminum, nickel, iron, niobium, titanium, silicon, indium or tin or/and a semiconductor as appropriate, so as to have conductivity. Further, the solution can also be used in admixture of fine particles of a metal oxide such as aluminum oxide, zirconium oxide, titanium oxide or silicon oxide as required. Further, to improve the wettability of the solution against an object to be coated and the leveling property of a coating film and to prevent the occurrences of spots and orange peel in the coating film, a surface tension regulator such as a fluorine-based surfactant, a silicon-based surfactant or a nonionic surfactant can be added in such a small amount that does not impair the desired effect as required. Illustrative examples of nonionic surfactants which can be added include a fluorine-based surfactant having a fluorinated alkyl group or a perfluoroalkyl group and a polyether alkyl based surfactant having an oxyalkyl group. Illustrative examples of the above fluorine-based surfactant include $C_9F_{19}CONHC_{12}H_{25}$, $C_8F_{17}SO_2NH-(C_2H_4O)_6H$, $C_9F_{17}O(PLURONIC\ L-35)C_9F_{17}$ and $C_9F_{17}O(PLURONIC\ P-84)C_9F_{17}$ (wherein PLURONIC L-35: product of Asahi Denka Co., Ltd., polyoxypropylene-polyoxyethylene block copolymer, average molecular weight=1,900; PLURONIC P-84: product of Asahi Denka Co., Ltd., polyoxypropylene-polyoxyethylene block copolymer, average molecular weight=4,200; TETRONIC-704: product of Asahi Denka Co., Ltd., N,N,N',N'-tetrakis(polyoxypropylene-polyoxyethylene block copolymer), average molecular weight=5,000). Specific examples of these fluorine-based surfactants include EFTOP EF301, EF303 and EF352 (products of SHIN AKITA KASEI CO., LTD.), MEGAFACE F171 and F173 (products of DAINIPPON INK AND CHEMICALS, INCORPORATED), ASAHI GUARD AG710 (product of ASAHI GLASS CO., LTD.), FLORAD PC-170C, FC430 and FC431 (products of Sumitomo 3M), SURFLON S-382, SC101, SC102, SC103, SC104, SC105 and SC106 (products of ASAHI GLASS CO., LTD.), BM-1000 and BM-1100 (products of B.M-Chemie Co., Ltd.) and Schsego-Fluor (product of Schwegmann CO., Ltd.). Further, illustrative examples of the polyether alkyl based surfactant include a polyoxyethylene alkyl ether, a polyoxyethylene allyl ether, a polyoxyethylene alkyl phenol ether, a polyoxyethylene fatty acid ester, a sorbitan fatty acid ester, a polyoxyethylene sorbitan fatty acid ester and an oxyethylene oxypropylene block polymer. Specific examples of these polyether alkyl based surfactants include EMULGEN 105, 430, 810 and 920, REODOLE SP-40S and TW-L120, EMANOLE 3199 and 4110, EXEL P-40S, BRIDGE 30, 52, 72 and 92, ARACEL 20, EMASOLE 320, TWIN 20 and 60 and MERGE 45 (products of KAO CORPORATION), and NONIBOL 55 (product of Sanyo Chemical Industries, Ltd.). Illustrative examples of nonionic surfactants other than those enumerated above include a polyoxyethylene fatty acid ester, a polyoxyethylene sorbitan fatty acid ester, and a polyalkylene oxide block copolymer. Specific examples thereof include CHEMISTAT 2500 (product of Sanyo Chemical Industries, Ltd.), SN-EX 9228 (product of SAN NOPCO LTD.) and NONAL 530 (product of TOHO CHEMICAL INDUSTRY CO., LTD.).

Solvents which can be used in the film forming composition in the present invention are any solvents which dissolve the complex (1) of the amine compound and the hydrogenated aluminum compound and the titanium-containing compound (2) and do not react with the complex (1) and the compound (2). Illustrative examples of such solvents include hydrocarbon-based solvents such as n-pentane, cyclopentane, n-hexane, cyclohexane, n-heptane, cycloheptane, n-octane, cyclooctane, decane, cyclodecane, dicyclopentadiene hydride, benzene, toluene, xylene, durene, indene, tetrahydronaphthalene, decahydronaphthalene and squalane; ether-based solvents such as diethyl ether, dipropyl ether, dibutyl ether, ethylene glycol dimethyl ether, ethylene glycol diethyl ether, ethylene glycol methylethyl ether, diethylene glycol dimethyl ether, diethylene glycol diethyl ether, diethylene glycol methylethyl ether, tetrahydrofuran, tetrahydropyran, bis(2-methoxyethyl)ether and p-dioxane; and polar solvents such as methylene chloride and chloroform. Of these, the hydrocarbon-based solvent or a mixture of the hydrocarbon-based solvent and the ether-based solvent is preferably used from the viewpoints of solubility and the stability of the solution. These solvents may be used alone or in admixture of two or more.

The solid concentration of the film forming composition in the present invention is preferably 0.1 to 100 wt %, more preferably 10 to 80 wt %. It can be adjusted to a proper concentration according to the thickness of a desired conductive film.

Next, a film forming composition used in the second method of the present invention will be described.

As a complex of an amine compound and hydrogenated aluminum, the same complex as that described with respect to the first method is used. It should be understood that what has been described about the complex in the first method directly applies to the complex in the second method.

Illustrative examples of metal particles which are preferably used in the present invention include Al, Cu, Ag, Au, Ni, Ru, Pd, Pt and Sn. These metal particles are used alone or in combination of two or more. As these metal particles, commercially available metal particles can be used either directly or after oxides on the surfaces are removed by acid or alkali. The acid or alkali for removing the oxides on the surfaces depends on the type of metal to be surface-treated. Although the acid or alkali is not particularly limited, hydrochloric acid, sulfuric acid, nitric acid, hydrofluoric acid, etc., aqueous solutions of these acids, and aqueous solutions of alkalis such as sodium hydroxide and potassium hydroxide can be used, for example.

The particle diameters of the metal particles are preferably not larger than 10 μm, more preferably not larger than 5 μm, particularly preferably not larger than 1 μm.

The film forming composition used in the present invention which comprises (1) the complex of an amine compound and a hydrogenated aluminum compound, (2) the metal particles, and (3) a solvent as required, is not limited to a particular production method. It is prepared by adding a given amount of the metal particles to a solution of the complex of an amine compound and a hydrogenated aluminum compound under agitation. The temperature at which the metal particles are added is preferably 0 to 150° C., more preferably 5 to 100° C., and the agitation time is preferably 0.1 to 120 minutes, more preferably 0.2 to 60 minutes.

The solvent used in this reaction may be any solvent capable of dissolving the complex of an amine compound and a hydrogenated aluminum compound. As the solvent, the same solvents as those to be described later which can be used for the film forming composition can be used.

The film forming composition used in the present invention may contain an aluminum compound other than the complex of an amine compound and alan. Examples of aluminum compounds other the above complex which can be added are the same aluminum compounds as those exemplified with respect to the first method.

As for the proportions of the complex (1) of an amine compound and a hydrogenated aluminum compound and the metal particles (2), the amount of the metal particles (2) is preferably 0.01 to 100 parts by weight, more preferably 0.05 to 80 parts by weight, based on 100 parts by weight of the complex. When the amount of the metal particles is lower than 0.01 parts by weight, a film with a high density may not be obtained, while when it is higher than 100 parts by weight, the stability of the solution may be difficult to attain.

The solution of the film forming composition in the present invention can be used in admixture of fines particles of metal such as iron, niobium, titanium, silicon or indium or/and a semiconductor as appropriate, so as to have conductivity. Further, the solution can also be used in admixture of fine particles of a metal oxide such as zirconium oxide, titanium oxide or silicon oxide as required.

Further, to improve the wettability of the solution against an object to be coated and the leveling property of a coating film and to prevent the occurrences of spots and orange peel in the coating film, a surface tension regulator such as a fluorine-based surfactant, a silicon-based surfactant or a nonionic surfactant can be added in such a small amount that does not impair the desired effect as required. Specific examples of the surfactants are the same as those enumerated with respect to the first method.

Solvents which can be used in the film forming composition are any solvents which dissolve the complex (1) of an amine compound and a hydrogenated aluminum compound and do not react with the complex (1). For example, the same solvents as those exemplified with respect to the first method can be used.

The solid concentration of the film forming composition is preferably 0.1 to 100 wt %, more preferably 10 to 80 wt %. It can be adjusted to a proper concentration according to the thickness of a desired conductive film.

Next, the first and second methods will be described.

The film forming solution composition obtained in the first or second method is coated on a substrate. The material and shape of the substrate to be used are not particularly limited. Its material is preferably capable of tolerating a heat treatment in a subsequent step. Further, the substrate on which a coating film is formed may have an even surface or an uneven surface, and its shape is not particularly limited. Specific examples of such a material for the substrate include glass, metal, plastic and ceramic. As glass, quartz glass, borosilicate glass, soda glass and lead glass can be used, for example. As metal, gold, silver, copper, nickel, silicon, aluminum, iron and stainless steel can be used, for example. As plastic, a polyimide and a polyether sulfone can be used, for example. Further, these materials are not limited to particular shapes and may be in the shape of a bulk, a plate or a film. Further, a method of coating the solution is not particularly limited and may be spin coating, dip coating, curtain coating, roll coating, spray coating, ink-jet printing or off-set printing. The solution may be coated once or multiple times. A suitable thickness of the coating film varies depending on the coating method and the solid concentration. The film thickness is preferably 0.001 to 100 μm, more preferably 0.005 to 50 μm.

Further, in the present invention, the above substrate can be prepared as a substrate which has a coating film (base layer) formed by coating the substrate with a solution which contains an organometallic compound containing a metal atom selected from the group consisting of Ti, Pd and Al. Due to the presence of such a base layer, adhesion between the substrate and the aluminum film is retained in a stable condition.

Illustrative examples of an organometallic compound containing a Ti atom include a titanium alkoxide, a titanium compound containing an amino group, a titanium compound with β-diketone, a titanium compound containing a cyclopentadienyl group, and a titanium compound containing a halogen group.

Illustrative examples of an organometallic compound containing a Pd atom include a palladium complex containing a halogen group, acetates, a palladium complex with β-diketone, a palladium complex with a compound containing a conjugated carbonyl group, and a phosphine-based palladium complex.

Further, illustrative examples of an organometallic compound containing an Al atom include an aluminum alkoxide, an aluminum alkylate, and an aluminum complex with β-diketone, excluding an alan-amine complex.

Illustrative examples of the organometallic compounds include the same titanium-containing compounds as the titanium-containing compounds used in the conductive film forming composition in the first method, palladium complexes having a halogen atom such as palladium chloride, allyl palladium chloride, dichlorobis (acetonitrile)palladium and dichlorobis(benzonitrile)palladium, acetates such as palladium acetate; palladium complexes with β-diketone such as palladium-2,4-pentane dionate and palladium hexafluoropentane dionate; palladium complexes with a compound having a conjugated carbonyl group such as bis(dibenzylideneacetone)palladium; phosphine-based palladium complexes such as bis[1,2-bis(diphenylphosphino)ethane]palladium, bis(triphenylphosphine)palladium chloride, bis(triphenylphosphine)palladium acetate, diacetate bis(triphenylphosphine)palladium, dichloro[1,2-bis(diphenylphosphine)ethane]palladium, trans-dichlorobis (tricyclohexylphosphine)palladium, trans-dichlorobis (triphenylphosphine)palladium, trans-dichlorobis(tri-o- tolylphosphine)palladium and tetrakis(triphenylphosphine) palladium; aluminum alkoxides such as aluminum ethoxide, aluminum isopropoxide, aluminum-n-butoxide, aluminum-s-butoxide, aluminum-t-butoxide, aluminum ethoxyethoxy ethoxide, aluminum phenoxide and aluminum lactate; aluminum alkylates such as aluminum acetate, aluminum acrylate, aluminum methacrylate and aluminum cyclohexane butyrate; and aluminum complexes with β-diketone such as aluminum-2,4-pentane dionate, aluminum hexafluoropentane dionate, aluminum-2,2,6,6-tetramethyl-3,5-heptane dionate, aluminum-s-butoxide bis(ethylacetoacetate), aluminum di-s-butoxide ethyl acetoacetate and aluminum diisopropoxide ethyl acetoacetate.

Of these, titanium isopropoxide, aluminum isopropoxide, titanium bis(ethylacetoacetate)diisopropoxide, titanium tetra (acetoacetate), palladium-2,4-pentane dionate, palladium hexafluoropentane dionate, aluminum-2,4-pentane dionate and aluminum hexafluoropentane dionate are preferably used.

As a solvent used in the solution of the organometallic compound containing a Ti, Pd or Al atom, any solvents which can dissolve, solely or as a mixed solvent with water, the organometallic compound can be used. Illustrative examples of such solvents include water; ethers such as tetrahydrofuran, dioxane, ethylene glycol dimethyl ether, ethylene glycol diethyl ether, diethylene glycol dimethyl ether and diethylene glycol diethyl ether; esters having an ether group such as ethylene glycol monomethyl ether acetate, ethylene glycol monoethyl ether acetate, propylene glycol monomethyl ether acetate and propylene glycol monoethyl ether acetate; hydrocarbons such as toluene, xylene, hexane, cyclohexane, octane, decalin, tetralin and durene; alcohols such as methanol, ethanol and propanol; and aprotic polar solvents such as N-methylpyrrolidone, N,N-dimethyl formamide, N,N-dimethyl acetamide, hexamethyl phosphoamide and γ-butyrolactone. These solvents can be used alone or as a mixed solvent with water.

The solution of the organometallic compound can be applied to the substrate by the same method as used to apply the solution of the conductive film forming composition. The thickness of the coating film (base layer) after removal of the solvent is preferably 0.001 to 10 μm, more preferably 0.005 to 1 μm. When the base layer is too thick, the flatness of the film is difficult to obtain, while when the base layer is too thin, the base layer may have poor adhesion to the substrate or the film that it contacts. The base layer is formed by applying the above solution and heating the applied solution so as to remove the solvent. The heating temperature is 30 to 350° C., preferably 40 to 300° C.

The substrate used in the present invention may be a substrate having a hydrophobic portion and a hydrophilic portion on the same substrate. Thereby, a conductive film can be formed only in specific portions on the substrate.

A portion corresponding to the hydrophobic portion on the substrate used in the present invention which has the hydrophobic portion and a hydrophilic portion on the same substrate is formed by applying a solution containing, e.g., hexamethyldisilazane or the above fluorine-based surfactant, only to the target portion and baking the applied portion at 100 to 500° C. To apply the solution containing hexamethyldisilazane or the above fluorine-based surfactant only to the target portion, the whole surface of the substrate is made hydrophilic to be described later first, a necessary hydrophilic portion is covered, and the target hydrophobic portion is then made hydrophobic. A method of covering the hydrophilic portion is not particularly limited. For example, a method is used which comprises conducting patterning by a known photolithography method to cover the portion which does not correspond to the hydrophobic portion with a known resist, or a method is used which comprises using a masking tape to cover the portion which does not correspond to the hydrophobic portion. Then, after forming a conductive film in the portion which corresponds to the hydrophobic portion, the used resist or masking tape is removed. Further, it is also possible that the whole surface of the substrate is made hydrophobic first and a specific portion is then made hydrophilic in a similar manner.

Further, a portion corresponding to the hydrophilic portion on the substrate used in the present invention which has the hydrophobic portion and the hydrophilic portion on the same substrate can be obtained by applying a solution of a compound containing a Ti, Pd or Al atom to the portion corresponding to the hydrophilic portion on the substrate and drying the applied solution.

As the organometallic compound, the same compounds as the organic compounds described above with respect to the base film can be preferably used.

In the methods of the present invention, the coating film of the solution of the conductive film forming composition is subjected to a heat treatment and/or a light treatment so as to be converted into wiring or an electrode which is a conductive film. The heat treatment temperature is preferably 60° C. or higher, more preferably 70 to 500° C. The heating time ranges from 30 seconds to about 120 minutes, for example. Further, the atmosphere for the heat treatment is preferably an inert gas with minimum oxygen because a conductive film of good quality can be obtained. As the above inert gas, nitrogen, helium and argon can be used, for example. Further, a mixed gas containing hydrogen may also be used as the inert gas. Further, the coating film of the solution using the conductive-film-forming composition may be treated with light so as to form a conductive film. As a light source used for the light treatment, a low-pressure or high-pressure mercury lamp, a deuterium lamp, discharge light of noble gas such as argon, krypton or xenon, a YAG laser, an argon laser, a carbon dioxide laser, and excimer lasers of XeF, XeCl, XeBr, KrF, KrCl, ArF, ArCl and the like can be used. As these light sources, those with an output of 10 to 5,000 W are preferably used, but those with an output of 100 to 1,000 W are more preferably sufficient. The wavelengths of these light sources are not particularly limited but are preferably 170 nm to 600 nm. Use of a laser beam is particularly preferred from the viewpoint of an effect of modifying the conductive film. The temperature at the time of the light treatment preferably ranges from room temperature to 200° C. Further, to expose only a specific portion to light, the coating film may be exposed via a mask.

A suitable thickness of the conductive film varies depending on the coating method and the solid concentration. The thickness of the film is preferably 0.01 to 100 μm, more preferably 0.05 to 10 μm. When the film is too thick, the flatness of the film is difficult to attain, while when the film is too thin, it may have poor adhesion to the substrate or the film that it contacts.

The conductive film obtained as described above can be suitably used as an electrode for a solar cell, a semiconductor device and an electronic device such as an electronic display device.

Further, when the above conductive film is formed in the form of a pattern, it can be used as wiring for the above electronic device.

A method of forming the conductive film in the form of a pattern is not particularly limited. Illustrative examples of such a method include (1) a method comprising forming the conductive film as described above and then removing unnecessary portions of the conductive film by etching so as to form a wiring pattern, (2) a method comprising applying a solution of an organometallic compound only to a portion corresponding to a wiring pattern on a substrate and then subjecting the coated portion to heating and/or a light treatment so as to form the wiring pattern, and (3) a method comprising applying a solution of an organometallic compound on a substrate and then exposing only a portion corresponding to a wiring pattern to light so as to form the wiring pattern.

In the above method (1), there can be used a method comprising applying a photoresist on the conductive film formed on the substrate, irradiating the photoresist with light via a photomask having a desired pattern so as to develop it and then performing etching by use of an alkaline aqueous solution.

As a coating method in the above method (2), an ink-jet method can be used, for example. The solution of the organometallic compound applied in the form of a pattern can be subjected to heating and/or a light treatment in the same manner as in formation of the above conductive film so as to form the wiring pattern.

In the above method (3), light can be irradiated via a photomask having a desired wiring pattern, for example. The light can be irradiated under the same conditions as those for formation of the above conductive film.

When the thus obtained conductive film is left to stand in the air, it is oxidized easily, and an aluminum oxide layer is formed on the surface. This may be a problem when the conductive film is used as wiring and/or an electrode. To prevent the oxidization, it is preferred to form a protective film solution in an inert gas atmosphere after the conductive film is formed in an inert gas atmosphere. As the protective film, (i) a metal film selected from the group consisting of Ti, Pd and Al or (ii) an organic polymer film is preferably used, for example.

The above metal film can be formed by, e.g., applying a solution of the same organometallic compound as the above organometallic compound for forming the base layer and then subjecting the applied solution to heating and/or exposure so as to convert the organometallic compound to corresponding metal. The heating and/or exposure can be carried out under the same conditions as those described above.

Meanwhile, the organic polymer film can be formed by applying a solution of an organic polymer, scattering the solvent at a temperature of, e.g., 50 to 200° C. to be removed and drying the resulting film. The polymer used in the solution is not particularly limited. For example, homopolymers such as poly(meth)acrylates, e.g., a polymethyl methacrylate, a polybutyl methacrylate and a polyethyl acrylate, a polystyrene, a polybutene, a polyvinyl alcohol, a polyvinyl acetate and a polybutadiene or copolymers of these polymers can be used. As solvents used in these polymer solutions, any solvents which can dissolve the polymers can be used.

The thickness of the protective film after removal of the solvent is preferably 0.001 μm to 10 μm, more preferably 0.01 μm to 1 μm. When the protective film is too thick, the flatness of the film is difficult to attain, while when it is too thin, it may have poor adhesion to the substrate or the film that it contacts.

EXAMPLES

Hereinafter, the present invention will be further described with reference to Examples. However, the present invention shall not be limited to these Examples in any way.

Example 1

100 g of 35% xylene solution of a complex of triethylamine synthesized from triethylamine hydrochloride and lithium aluminum hydride and alan was weighed into a 200-ml flask at room temperature in a nitrogen atmosphere. To the solution, 0.23 g of titanium bis(ethylacetoacetate)diisopropoxide was added dropwise at room temperature. Then, the resulting solution was heated at 80° C. for 3 minutes and then allowed to cool to room temperature, thereby preparing a composition comprising (1) the complex of the amine compound and hydrogenated aluminum, (2) the titanium-containing compound and (3) the organic solvent. Then, a 10-cm square glass substrate was immersed in a 10% toluene solution of titanium bis(ethylacetoacetate)diisopropoxide for 1 hour and then dried at 100° C. for 30 minutes and 300° C. for 30 minutes so as to prepare a hydrophilic substrate. The glass substrate was spin-coated with the composition comprising (1) the complex of the amine compound and hydrogenated aluminum, (2) the titanium-containing compound and (3) the organic solvent at 1,000 rpm for 20 minutes in a nitrogen atmosphere and then prebaked at 80° C. so as to remove the solvent, thereby forming a film comprising (1) the complex of triethylamine and alan and (2) the titanium-containing compound. When the coating film was further heated at 200° C. for 30 minutes in a nitrogen atmosphere so as to be thermally decomposed, a film having metallic luster was formed on the glass substrate. When the thickness of the film on the substrate was measured by use of α-step (product of Tenchor Co., Ltd.), it was found to be 175 nm. When ESCA of the film was measured, a peak attributed to $Al_{2p}$ aluminum was observed at 73.5 eV. Further, when the density of the film was measured by Rutherford Backscattering Spectroscopy (RBS), the density of 2.4 g/cm$^3$ was obtained. Further, when the conductivity of the film was examined, a specific resistance of 17 μΩ·cm was obtained. Hence, it was found that the film could be suitably used as an electrode for an electronic device.

Example 2

A composition comprising (1) a complex of an amine compound and hydrogenated aluminum, (2) a titanium-containing compound and (3) an organic solvent was prepared in the same manner as in Example 1 except that 0.24 g of titanium tetra(acetylacetate) was used in place of 0.23 g of titanium bis(ethylacetoacetate)diisopropoxide. 2 ml of the thus obtained coating solution was spin-coated and then baked in the same manner as in Example 1 so as to form a 220-nm-thick film having aluminum luster on a 10-cm square glass substrate surface-treated with a 10% toluene solution of titanium bis(ethylacetoacetate)diisopropoxide. When the density of the film was measured by RBS, the density of 2.3 g/cm$^3$ was obtained. Further, when the resistance of the film was measured, a specific resistance of 23 μΩ·cm was obtained. Hence, it was found that the film could be suitably used as an electrode for an electronic device.

Example 3

A composition comprising (1) a complex of an amine compound and hydrogenated aluminum, (2) a titanium-containing compound and (3) an organic solvent was prepared in the same manner as in Example 1 except that 0.13 g of dicyclopentadienyl titanium dichloride was used in place of 0.23 g of titanium bis(ethylacetoacetate)diisopropoxide. 2 ml of the thus obtained coating solution was spin-coated and then baked in the same manner as in Example 1 so as to form a 270-nm-thick film having aluminum luster on a 10-cm square glass substrate surface-treated with a 10% toluene solution of titanium bis(ethylacetoacetate)diisopropoxide. When the density of the film was measured by RBS, the density of 2.4 g/cm$^3$ was obtained. Further, when the resistance of the film was measured, a specific resistance of 8 μΩ·cm was obtained.

Hence, it was found that the film could be suitably used as an electrode for an electronic device.

Example 4

A composition comprising (1) a complex of an amine compound and hydrogenated aluminum, (2) a titanium-containing compound and (3) an organic solvent was prepared in the same manner as in Example 1 except that 0.066 g of dicyclopentadienyl titanium dichloride was used in place of 0.23 g of titanium bis(ethylacetoacetate)diisopropoxide. 2 ml of the thus obtained coating solution was spin-coated and then baked in the same manner as in Example 1 so as to form a 230-nm-thick film having aluminum luster on a 10-cm square glass substrate surface-treated with a 10% toluene solution of titanium bis (ethylacetoacetate) diisopropoxide. When the density of the film was measured by RBS, the density of 2.4 g/cm$^3$ was obtained. Further, when the resistance of the film was measured, a specific resistance of 9 μΩ·cm was obtained. Hence, it was found that the film could be suitably used as an electrode for an electronic device.

Example 5

A composition comprising (1) a complex of an amine compound and hydrogenated aluminum, (2) a titanium-containing compound and (3) an organic solvent was prepared in the same manner as in Example 1 except that 0.12 g of cyclopentadienyl titanium trichloride was used in place of 0.23 g of titanium bis(ethylacetoacetate)diisopropoxide. 2 ml of the thus obtained coating solution was spin-coated and then baked in the same manner as in Example 1 so as to form a 210-nm-thick film having aluminum luster on a 10-cm square glass substrate surface-treated with a 10% toluene solution of titanium bis(ethylacetoacetate)diisopropoxide. When the density of the film was measured by RBS, the density of 2.4 g/cm$^3$ was obtained. Further, when the resistance of the film was measured, a specific resistance of 11 μΩ·cm was obtained. Hence, it was found that the film could be suitably used as an electrode for an electronic device.

Example 6

A composition comprising (1) a complex of an amine compound and hydrogenated aluminum, (2) a titanium-containing compound and (3) an organic solvent was prepared in the same manner as in Example 1 except that 0.058 g of cyclopentadienyl titanium trichloride was used in place of 0.23 g of titanium bis(ethylacetoacetate)diisopropoxide. 2 ml of the thus obtained coating solution was spin-coated and then baked in the same manner as in Example 1 so as to form a 2.20-nm-thick film having aluminum luster on a 10-cm square glass substrate surface-treated with a 10% toluene solution of titanium bis (ethylacetoacetate)diisopropoxide. When the density of the film was measured by RBS, the density of 2.3 g/cm$^3$ was obtained. Further, when the resistance of the film was measured, a specific resistance of 10 μΩ·cm was obtained. Hence, it was found that the film could be suitably used as an electrode for an electronic device.

Comparative Example 1

Without using titanium bis(ethylacetoacetate)diisopropoxide used in Example 1, 2 ml of 35% solution of a complex of triethylamine synthesized from triethylamine hydrochloride and lithium aluminum hydride and alan was spin-coated and then baked in the same manner as in Example 1 so as to form a 210-nm-thick film having aluminum luster on a 10-cm glass substrate surface-treated with a 10% toluene solution of titanium bis(ethylacetoacetate)diisopropoxide. When the resistance of the film was measured, a specific resistance of 65 μΩ·cm was obtained. Thus, it was found that a conductive film was obtained, but its specific resistance was relatively low. Further, when the density of the film was measured by RBS, the density of 1.6 g/cm$^3$ was obtained, indicating that the film density was also relatively low.

Example 7

100 g of 35% xylene solution of a complex of triethylamine synthesized from triethylamine hydrochloride and lithium aluminum hydride and alan was weighed into a 200-ml flask at room temperature in a nitrogen atmosphere. To the solution, 3.5 g of 70-nm diameter Ag particles of ULVAC INC. was added at room temperature and agitated for 30 minutes, thereby preparing a composition comprising (1) the complex of the amine compound and hydrogenated aluminum, (2) the Ag particles and (3) the organic solvent. Then, a 10-cm square glass substrate was immersed in a 10% toluene solution of titanium bis(ethylacetoacetate)diisopropoxide for 1 hour and then dried at 100° C. for 30 minutes and 300° C. for 30 minutes so as to prepare a hydrophilic substrate. The glass substrate was spin-coated with the composition comprising (1) the complex of the amine compound and hydrogenated aluminum, (2) the Ag particles and (3) the organic solvent at 1,000 rpm for 20 minutes in a nitrogen atmosphere and then prebaked at 80° C. so as to remove the solvent, thereby forming a film comprising (1) the complex of triethylamine and alan and (2) the Ag particles. When the coating film was further heated at 200° C. for 30 minutes in a nitrogen atmosphere so as to be thermally decomposed, a film having metallic luster was formed on the glass substrate. When the thickness of the film on the substrate was measured by use of α-step (product of Tenchor Co., Ltd.), it was found to be 800 nm. When ESCA of the film was measured, a peak attributed to $Al_{2p}$ aluminum was observed at 73.5 eV. Further, when the light transmittance of the film was measured, a transmittance of 0% at a wavelength of 300 nm was obtained, indicating that a dense aluminum film was obtained. Further, when the conductivity of the film was examined, a specific resistance of 75 μΩ·cm was obtained. Hence, it was found that the film could be suitably used as an electrode for an electronic device.

Example 8

A composition comprising (1) a complex of an amine compound and hydrogenated aluminum, (2) Cu particles and (3) an organic solvent was prepared in the same manner as in Example 7 except that 3.5 g of Cu particles with a particle diameter of 450 nm of Aldrich Co., Ltd. were used in place of 3.5 g of Ag particles. 2 ml of the thus obtained coating solution was spin-coated and then baked in the same manner as in Example 7 so as to form a 750-nm-thick film having aluminum luster on a 10-cm glass substrate treated with the same 10% toluene solution of titanium bis(ethylacetoacetate)diisopropoxide as used in Example 7. When the light transmittance of the film was measured, a transmittance of 0% at a wavelength of 300 nm was obtained, indicating that adense aluminum film was obtained. Further, when the resistance of the film was measured, a specific resistance of 65 μΩ·cm was obtained. Hence, it was found that the film was suitable as an electrode for an electronic device.

Example 9

A composition comprising (1) a complex of an amine compound and hydrogenated aluminum, (2) Ag particles and (3) an organic solvent was prepared in the same manner as in Example 7 except that a 35% toluene solution was used in place of the 35% xylene solution of the complex of triethylamine synthesized from triethylamine hydrochloride and lithium aluminum hydride and alan. 2 ml of the thus obtained coating solution was spin-coated on the same glass substrate as used in Example 7 at 1,000 rpm for 20 seconds in a nitrogen atmosphere and then baked at 80C for 10 minutes and 200° C. for 30 minutes so as to obtain a 700-nm-thick film having aluminum luster. Further, when the light transmittance of the film was measured, a transmittance of 0% at a wavelength of 300 nm was obtained, indicating that a dense aluminum film was obtained. When the resistance of the film was measured, a specific resistance of 80 µΩ·cm was obtained. Hence, it was found that the film was suitable as an electrode for an electronic device.

Example 10

A composition comprising (1) a complex of an amine compound and hydrogenated aluminum, (2) Cu particles and (3) an organic solvent was prepared in the same manner as in Example 7 except that in place of the 35% xylene solution of the complex of triethylamine synthesized from triethylamine hydrochloride and lithium aluminum hydride and alan, a 35% toluene solution of the complex was used. 2 ml of the thus obtained coating solution was spin-coated on the same glass substrate as used in Example 7 at 1,000 rpm for 20 seconds in a nitrogen atmosphere and then baked at 80° C. for 10 minutes and 200° C. for 30 minutes so as to obtain a 800-nm-thick film having aluminum luster. When the light transmittance of the film was measured, a transmittance of 0% at a wavelength of 300 nm was obtained, indicating that a dense aluminum film was obtained. Further, when the resistance of the film was measured, a specific resistance of 75 µΩ·cm was obtained. Hence, it was found that the film was suitable as an electrode for an electronic device.

Example 11

A composition comprising (1) a complex of an amine compound and hydrogenated aluminum, (2) Ag particles and (3) an organic solvent was prepared in the same manner as in Example 7 except that 2.5 g of Ag articles were used in place of 3.5 g of the 70-nm Ag particles of ULVAC INC. 2 ml of the thus obtained coating solution was spin-coated on the same glass substrate as used in Example 7 at 1,000 rpm for 20 seconds in a nitrogen atmosphere and then baked at 80° C. for 10 minutes and 200° C. for 30 minutes so as to obtain a 600-nm-thick film having aluminum luster. When the light transmittance of the film was measured, a transmittance of 0% at a wavelength of 300 nm was obtained, indicating that a dense aluminum film was obtained. Further, when the resistance of the film was measured, a specific resistance of 70 µΩ·cm was obtained. Hence, it was found that the film was suitable as an electrode for an electronic device.

Example 12

A composition comprising (1) a complex of an amine compound and hydrogenated aluminum, (2) Cu particles and (3) an organic solvent was prepared in the same manner as in Example 8 except that 2.5 g of Cu articles was used in place of 3.5 g of the Cu particles with a particle diameter of 450 nm of Aldrich Co., Ltd. 2 ml of the thus obtained coating solution was spin-coated on the same glass substrate as used in Example 8 at 1,000 rpm for 20 seconds in a nitrogen atmosphere and then baked at 80° C. for 10 minutes and 200° C. for 30 minutes so as to obtain a 800-nm-thick film having aluminum luster. Further, when the light transmittance of the film was measured, a transmittance of 0% at a wavelength of 300 nm was obtained, indicating that a dense aluminum film was obtained. Further, when the resistance of the film was measured, a specific resistance of 80 µΩ·cm was obtained. Hence, it was found that the film could be suitably used as an electrode for an electronic device.

Comparative Example 2

Without using the Ag particles used in Example 7, 2 ml of 35% solution of a complex of triethylamine synthesized from triethylamine hydrochloride and lithium aluminum hydride and alan was spin-coated and then baked in the same manner as in Example 7 so as to form a 240-nm-thick film having aluminum luster on a 5-cm square glass substrate on which a 20-nm titanium oxide film was formed by sputtering. When the resistance of the film was measured, a specific resistance of 80 µΩ·cm was obtained, indicating that a conductive film was obtained. However, when the light transmittance of the film was measured, a transmittance of 8% at a wavelength of 300 nm was obtained, indicating that the density of the film was relatively low.

Example 13

A composition comprising (1) a complex of an amine compound and hydrogenated aluminum, (2) a titanium-containing compound and (3) an organic solvent and prepared in the same manner as in Example 1 was spin-coated on a hydrophilic substrate obtained by immersing 10-cm square borosilicate glass in a 10% titanium bis(ethylacetoacetate) diisopropoxide/toluene solution for 1 hour and then drying the glass at 100° C. for 30 minutes and 300° C. for 30 minutes. Then, the spin-coated substrate was prebaked at 80° C. so as to remove the solvent, whereby a film comprising (1) the complex of triethylamine and alan and (2) the titanium-containing compound was formed. As a result of further heating the coating film at 200° C. for 30 minutes in a nitrogen atmosphere, a film having metallic luster was formed. The thickness of the film on the substrate was 220 nm.

This film was coated with a photoresist for a G line (TFR9005D10G: product of JSR Corporation) by use of a spinner and then prebaked at 90° C. for 120 seconds so as to form a resist film. Then, the film was exposed (to light of 436 nm for 400 msec) through a photomask having a pattern having a width of 10 µm and a length of 5 cm by use of reducing projection exposure equipment NSR1505G4D of Nikon Corporation, developed by a 2.38-wt % tetrammonium hydroxide aqueous solution, rinsed with ultrapure water and then postbaked at 120° C. for 2 minutes so as to form a photoresist pattern on the conductive film.

Then, the resulting conductive film was immersed in a 0.1-N potassium hydroxide solution for 10 minutes and rinsed with ultrapure water so as to be etched, and the resist was removed by use of oxygen plasma so as to form wiring having metallic luster and having a thickness of 200 nm, a line width of 10 µm and a length of 5 cm.

Electric resistance between both ends of the formed wiring was 10 mΩ.

Example 14

A composition comprising (1) a complex of an amine compound and hydrogenated aluminum, (2) a titanium-containing compound and (3) an organic solvent and prepared in the same manner as in Example 1 was pattern-coated by an ink-jet method in the form of a straight line having a line width of 50 μm on a hydrophilic substrate obtained by immersing 10-cm borosilicate glass in a 10% titanium bis (ethylacetoacetate)diisopropoxide/toluene solution for 1 hour and then drying the glass at 100° C. for 30 minutes and 300° C. for 30 minutes. Then, the substrate was prebaked at 80° C. so as to remove the solvent, whereby a film comprising (1) the complex of triethylamine and alan and (2) the titanium-containing compound was formed. As a result of further heating the coating film at 200° C. for 30 minutes in a nitrogen atmosphere, wiring having metallic luster and having a thickness of 220 nm, a line width of 50 μm and a length of 5 cm was formed. Electric resistance between both ends of the wiring was 2 mΩ.

As described in detail above, according to the present invention, there is provided an industrial method of forming a film having conductivity easily by forming a coating film by a solution coating method such as a spin coating method or an ink-jet method and then subjecting the coating film to heat and/or light, unlike a conventional method of forming a conductive aluminum film by a vacuum process such as sputtering, vacuum deposition or CVD. This method has an advantage that wiring and an electrode which are uniform and dense films can be formed at low costs.

What is claimed is:

1. A composition for forming a conductive film comprising a complex of an amine compound and a hydrogenated aluminum compound, and a titanium compound selected from the group consisting of
a compound represented by the following formula (2):

$$Ti(OR^4)_x(CH_3COCHCOOR^5)_{4-x} \qquad (2)$$

wherein $R^4$ and $R^5$ are the same or different and are an alkyl group or a phenyl group, and x is 0 or an integer of 1 to 4,
a compound represented by the following formula (3):

$$Ti(OR^6)_y(X)_{4-y} \qquad (3)$$

wherein $R^6$ is an alkyl group or a phenyl group, X is a halogen atom, and y is an integer of 1 to 3,
a compound represented by the following formula (4):

$$Ti(OR^7)_z(NHR^8)_{4-z} \qquad (4)$$

wherein $R^7$ and $R^8$ are the same or different and are an alkyl group or a phenyl group, and z is 0 or an integer of 1 to 3, and
a compound represented by the following formula (5):

$$Ti(Cp)_n(Y)_{4-n} \qquad (5)$$

wherein Cp is cyclopentadienyl group, Y is a halogen atom or an alkyl group, and n is an integer of 1 to 4.

2. The composition of claim 1, comprising the titanium compound in an amount of 0.001 to 30 mol % based on the total amount of the complex and the titanium compound.

3. Wiring formed by a method comprising coating a substrate with a composition comprising (A) a complex of an amine compound and a hydrogenated aluminum compound, and (B) a titanium compound and then subjecting the obtained coating film to heating and/or a light treatment to form a conductive film, wherein
the titanium compound is selected from the group consisting of
a compound represented by the following formula (2):

$$Ti(OR^4)_x(CH_3COCHCOOR^5)_{4-x} \qquad (2)$$

wherein $R^4$ and $R^5$ are the same or different and are an alkyl group or a phenyl group, and x is 0 or an integer of 1 to 4,
a compound represented by the following formula (3):

$$Ti(OR^6)_y(X)_{4-y} \qquad (3)$$

wherein $R^6$ is an alkyl group or a phenyl group, X is a halogen atom, and y is an integer of 1 to 3,
a compound represented by the following formula (4):

$$Ti(OR^7)_z(NHR^8)_{4-z} \qquad (4)$$

wherein $R^7$ and $R^8$ are the same or different and are an alkyl group or a phenyl group, and z is 0 or an integer of 1 to 3, and
a compound represented by the following formula (5):

$$Ti(Cp)_n(Y)_{4-n} \qquad (5)$$

wherein Cp is cyclopentadienyl group, Y is a halogen atom or an alkyl group, and n is an integer of 1 to 4.

4. An electrode formed by a method comprising coating a substrate with a composition comprising (A) a complex of an amine compound and a hydrogenated aluminum compound, and (B) a titanium compound and then subjecting the obtained coating film to heating and/or a light treatment to form a conductive film, wherein
the titanium compound is selected from the group consisting of
a compound represented by the following formula (2):

$$Ti(OR^4)_x(CH_3COCHCOOR^5)_{4-x} \qquad (2)$$

wherein $R^4$ and $R^5$ are the same or different and are an alkyl group or a phenyl group, and x is 0 or an integer of 1 to 4,
a compound represented by the following formula (3):

$$Ti(OR^6)_y(X)_{4-y} \qquad (3)$$

wherein $R^6$ is an alkyl group or a phenyl group, X is a halogen atom, and y is an integer of 1 to 3,
a compound represented by the following formula (4):

$$Ti(OR^7)_z(NHR^8)_{4-z} \qquad (4)$$

wherein $R^7$ and $R^8$ are the same or different and are an alkyl group or a phenyl group, and z is 0 or an integer of 1 to 3, and
a compound represented by the following formula (5):

$$Ti(Cp)_n(Y)_{4-n} \qquad (5)$$

wherein Cp is cyclopentadienyl group, Y is a halogen atom or an alkyl group, and n is an integer of 1 to 4.

5. Wiring formed by a method comprising coating a substrate with a composition comprising (A) a complex of an amine compound and a hydrogenated aluminum compound, and (C) metal particles and then subjecting the obtained coating film to heating and/or a light treatment to form a conductive film.

6. An electrode formed by a method comprising coating a substrate with a composition comprising (A) a complex of an amine compound and a hydrogenated aluminum compound, and (C) metal particles and then subjecting the obtained coating film to heating and/or a light treatment to form a conductive film.

* * * * *